(12) United States Patent
Hwu et al.

(10) Patent No.: US 8,316,534 B2
(45) Date of Patent: Nov. 27, 2012

(54) METHOD FOR PACKAGING AIRTIGHT MULTI-LAYER ARRAY TYPE LED

(75) Inventors: Jon-Fwu Hwu, Hsinchu (TW); Yung-Fu Wu, Hsinchu (TW); Kui-Chiang Liu, Hsinchu (TW)

(73) Assignee: GEM Weltronics TWN Corporation, Hsinchu (TW)

( * ) Notice: Subject to any disclaimer, the term of this patent is extended or adjusted under 35 U.S.C. 154(b) by 32 days.

(21) Appl. No.: 13/014,706

(22) Filed: Jan. 26, 2011

(65) Prior Publication Data
US 2012/0186077 A1    Jul. 26, 2012

(51) Int. Cl.
*H05K 3/30* (2006.01)
(52) U.S. Cl. ............... 29/832; 29/833; 29/840; 438/26; 438/27; 438/28
(58) Field of Classification Search ............ 29/832, 29/833, 840; 438/26, 27, 28
See application file for complete search history.

(56) References Cited

U.S. PATENT DOCUMENTS

| 7,709,857 B2 * | 5/2010 | Kim et al. ............ 257/100 |
| 7,923,271 B1 * | 4/2011 | Hwu et al. ............ 438/26 |
| 2006/0102917 A1 * | 5/2006 | Oyama et al. ......... 257/99 |
| 2010/0314654 A1 * | 12/2010 | Hayashi ............... 257/99 |

* cited by examiner

*Primary Examiner* — Carl Arbes
(74) *Attorney, Agent, or Firm* — Lin & Associates IP, Inc.

(57) ABSTRACT

A method for packaging an airtight multi-layer array type LED is disclosed. The method includes: integrally forming a metal substrate with an airtight metal frame surrounding an accommodating space; forming a light outlet platform surrounding a light outlet opening on a bottom of the accommodating space; forming two horizontal sealing through holes in the airtight metal frame, wherein each sealing through hole has one lead frame inserted therethrough, and all interstitial space in the two horizontal sealing through holes is completely sealed with a sealing material; disposing the optical units and optical components in the accommodating space; sequentially forming a dice protection layer, a fluorescent layer, and a silicone layer on the LED dices; and installing an optical glass cover on the top surface of the airtight metal frame to seal the packaging structure of the present invention.

22 Claims, 13 Drawing Sheets

FIG. 13

METHOD FOR PACKAGING AIRTIGHT MULTI-LAYER ARRAY TYPE LED

BACKGROUND OF THE INVENTION

1. Field of the Invention

The present invention relates to a method for packaging an airtight multi-layer array type LED, and particularly relates to a method for packaging an airtight multi-layer array type LED capable of completely preventing moisture from entering it, and being durable in use, and keeping the performance of the optical devices for a long term.

2. The Prior Arts

The light-emitting theory of LED takes advantage of the intrinsic properties of semiconductors, which is different from the theory of electric discharging, heat and light-emitting of an incandescent light tube. Because light is emitted when electric current flows forward across the PN junction of a semiconductor, LED is also called cold light. LED has features of durability, long service life, light-weight, low power consumption, and being free of toxic mercury, and thereby it can be widely used in the industry of luminance equipment, and LEDs are often arranged in an array and often used in an electric bulletin board or traffic sign.

In the conventional method for packaging a multi-layer array type LED, a substrate is provided, and two lead frames are positioned in the lead frame groove of the substrate, and then the package module is injection molded so as to enclose and fix the substrate and two lead frames, and then the LED dices are arranged on the light-emitting area of the substrate, and the LED dices are electrically connected to the lead frame, and then a dice protection layer, and a fluorescent layer are sequentially formed on the LED dices, and then the package cover is injected so as to cover the package module. The LED dices are arranged in an array, and stacked one on top of another so as to form a multi-layered structure.

However, the conventional LED cannot be used in moisture and high humidity environments, such as deep sea, air space, or military. This is because each layer of the packaging structure is not completely air-tightly connected to each other, the airtightness is therefore gradually deteriorated, the moisture in the interior is increased, and each component of the packaging structure may be separated from each other, or may even be burned down and damaged. As a result, the conventional packaging structure can not be used in a moist environment, and the structural strength may also be gradually weakened. Therefore, the LEDs that have just been installed will need to be replaced after a short period of time. Maintenance and installation operations have to be performed every now and then in severe environment, and thereby time and labor are wasted and personnel safety is threatened. In view of the above-mentioned disadvantages, it would be highly desirable to develop a method for packaging a multi-layer array type LED which is capable of completely preventing moisture from entering it, being durable in use, and keeping the performance of optical devices for a long term.

BRIEF DESCRIPTION OF THE DRAWINGS

The present invention will be apparent to those skilled in the art by reading the following detailed description of the preferred embodiments thereof, with reference to the attached drawings, in which.

SUMMARY OF THE INVENTION

Accordingly, the objective of the present invention is to provide a method for packaging an airtight multi-layer array type LED, and the packaging structure of LED dices of the present invention has high structural strength and excellent airtightness, and thereby such a LED packaging structure is suitable to be used in a moist environment such as underwater. The metal substrate of the present invention is integrally formed with the airtight metal frame so that the whole structural strength is strong enough to work in extreme environments. The service life of optical components is thereby prolonged, and the performance of optical components is prevented from deteriorating for a long term.

In order to achieve the above objective, the present invention provides a method for packaging an airtight multi-layer array type LED, and the method comprises: integrally forming a metal substrate with an airtight metal frame, wherein an accommodating space is defined by the airtight metal frame; forming a light outlet platform on a bottom of the accommodating space, wherein a light outlet opening is defined by the light outlet platform; forming an airtight sealing groove around an upper surface of the airtight metal frame, wherein a sealing frame wall is upwardly and vertical extended from an outer edge of a top surface of the metal frame; forming two horizontal sealing through holes in the airtight metal frame, wherein one lead frame is inserted through each sealing through hole, and all interstitial space in the two horizontal sealing through holes is completely sealed with a sealing material; disposing a first light reflector to a sidewall of the light outlet platform, and disposing a second light reflector on the interior of the airtight metal frame, wherein a lower portion of one side of the second light reflector is placed against an outside of the light outlet platform, and an upper portion of the other side of the second light reflector is placed against an inner wall of the airtight metal frame, wherein the first and the second light reflectors receive light, and then reflect the received light outward; installing a plurality of LED dices on the bottom of the accommodating space, wherein each of the LED dice is electrically connected to each other by wire bonding, and the LED dices is electrically connected to the lead frame through a plurality of wires so as to form an electric circuit; forming a dice protection layer on the LED dices for covering and protecting the LED dices; forming a fluorescent layer on the dice protection layer; forming a silicone layer on the fluorescent layer; and installing an optical glass cover on a top surface of the airtight metal frame, wherein the optical glass cover is tightly jointed with the top surface of the airtight metal frame and an inner portion of the sealing frame wall.

DETAILED DESCRIPTION OF THE PREFERRED EMBODIMENT

Hereinafter, the preferred embodiments of the present invention will be described in detail with reference to the accompanying drawings.

Figure 1:
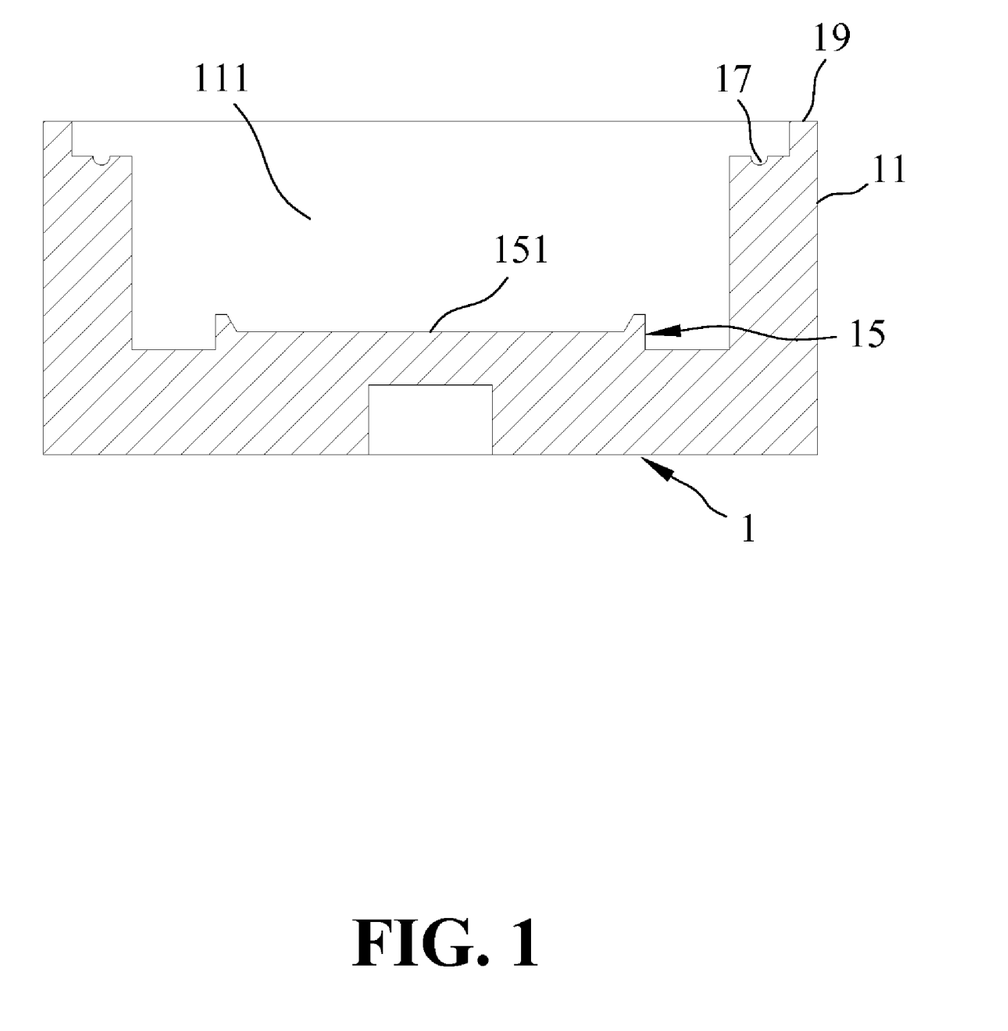
FIGS. 1-9 schematically illustrate various stages in a method for packaging airtight multi-layer array type LED in accordance with the first embodiment of the present invention.

FIGS. 1 to 9 schematically illustrate various stages in a method for packaging airtight multi-layer array type LED in accordance with the first embodiment of the present invention. As shown in FIG. 1, a metal substrate 1 with a metal frame 11 formed thereon is provided, wherein the metal substrate 1 and the metal frame 11 are integrally formed. An airtight sealing groove 17 is formed around the upper surface of the airtight metal frame 11, and a sealing frame wall 19 is upwardly and vertical extended from the outer edge of the top surface of the metal frame 11.

An accommodating space 111 is surrounded by the metal frame 1. A plurality of optical units, optical components or packaging materials can be disposed in the accommodating space 111. A light outlet opening 151 is surrounded by a light outlet platform 15 formed on the bottom of the airtight metal frame 11. The sidewall of the light outlet opening 151 is inclined at an angle of not more than 90 degrees with respect to the bottom of the light outlet opening, and the sidewall of the light outlet opening 151 is served as a light reflecting plane. The metal substrate 1 with a metal frame 11 formed thereon can be formed by casting or tooling. The material of the metal substrate 1 can be aluminum, copper, copper ally, or other metal materials having good heat conductivity so that heat is able to be rapidly and efficiently dissipated.

A protective reflection layer (not shown) can be coated on the inner wall of the airtight metal frame 11 to increase the light reflectivity thereof and to enhance the resistance to the environmental pressures. The material of the protective reflection layer can be silver (Ag), nickel (Ni) or any metal materials having good light reflectivity.

Figure 2:
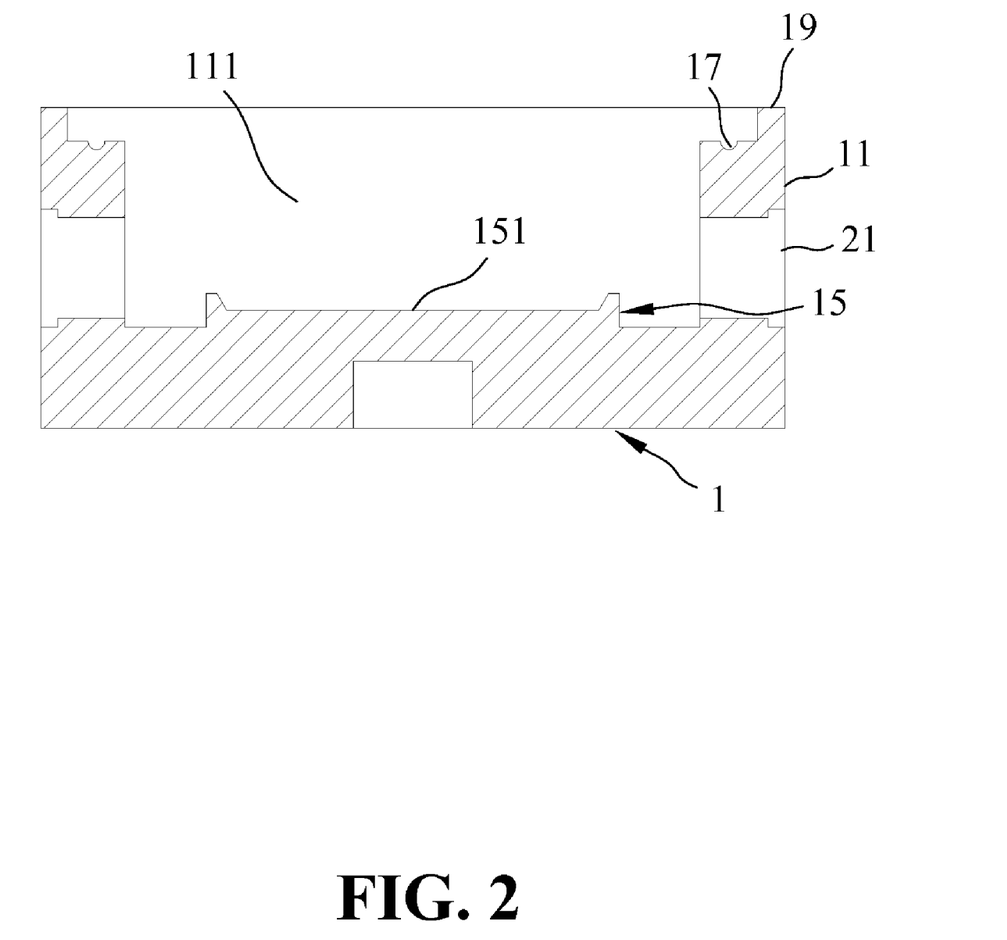
Figure 3:
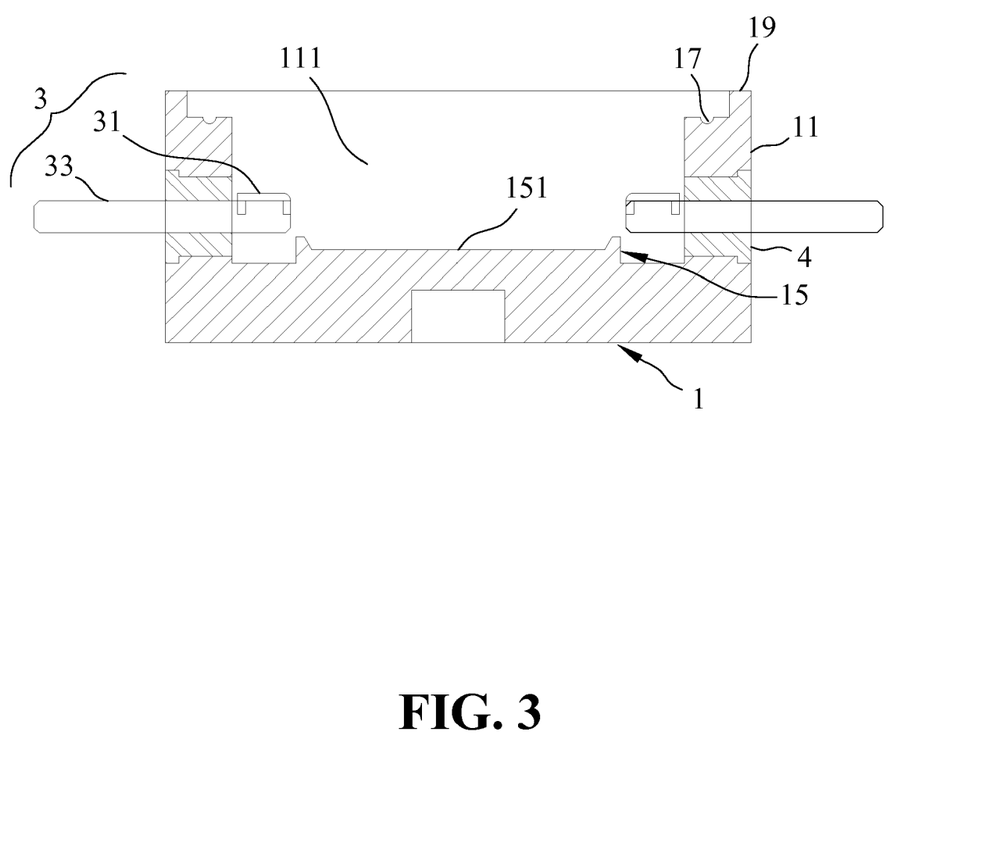

As shown in FIG. 2, two horizontal sealing through holes 21 are formed in the airtight metal frame 11. One lead frame 3 is inserted through each sealing through hole 21, and then all interstitial space in the two horizontal sealing through holes 21 are completely sealed with a sealing material 4. As shown in FIG. 3, each lead frame 3 consists of a connection plate 31, and a guide rod 33. Each guide rod 33 is inserted through each sealing through hole 21. The guide rod has an inner end and an outer end, and the inner end of the guide rod is connected with a connection plate, and the outer end of the guide rod is connected to a power source. It is noted that in this embodiment, the two horizontal the sealing through holes 21 are respectively arranged on two opposite sides of the sidewall of the airtight metal frame 11, and however, the arrangement of the sealing through holes 21 depends on the needs of the application, and the arrangement disclosed in this embodiment is illustrated generally, by way of example, but not by way of limitation. The scope of the invention should, therefore, be determined with reference to the appended claims, along with the full scope of equivalents to which such claims are entitled.

Figure 4:
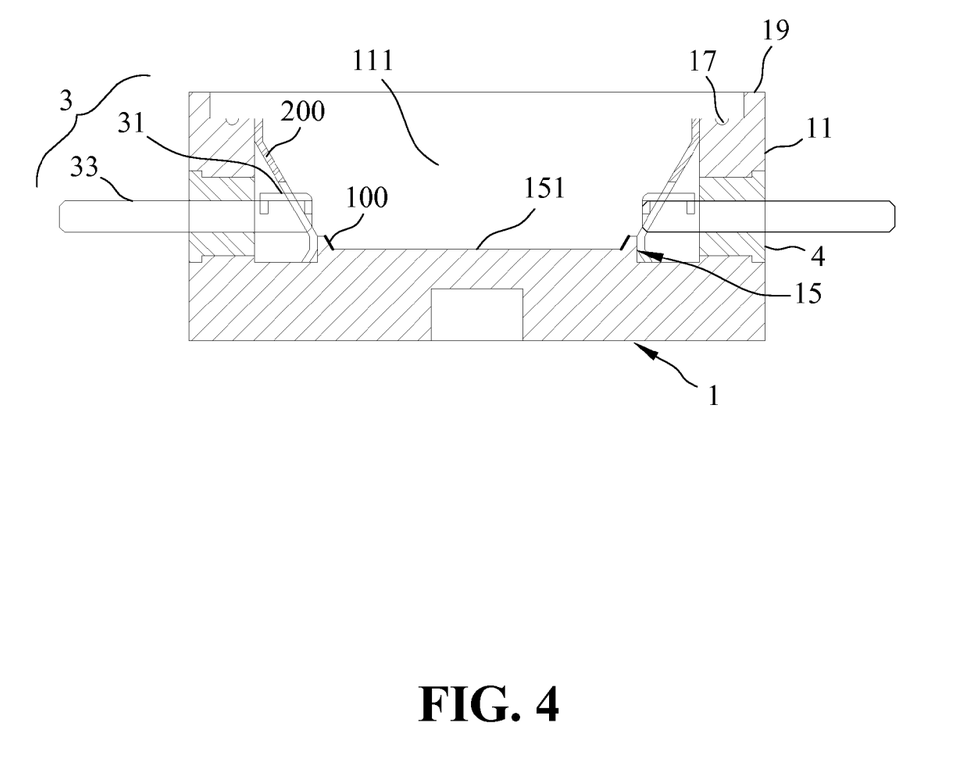

As shown in FIG. 4, a first light reflector 100 is attached to the sidewall of the light outlet platform 15. A second light reflector 200 is disposed on the interior of the airtight metal frame 11. The second light reflector 200 is wide at the top and narrow at the bottom. The lower portion of one side of the second light reflector 200 is placed against the outside of the light outlet platform 15, and the upper portion of the other side of the second light reflector 200 is placed against the inner wall of the airtight metal frame 11. The first and the second light reflectors 100, 200 receive light, and then reflect the received light outward in order to increase the light emitting brightness and efficiency of the LEDs.

Figure 5:
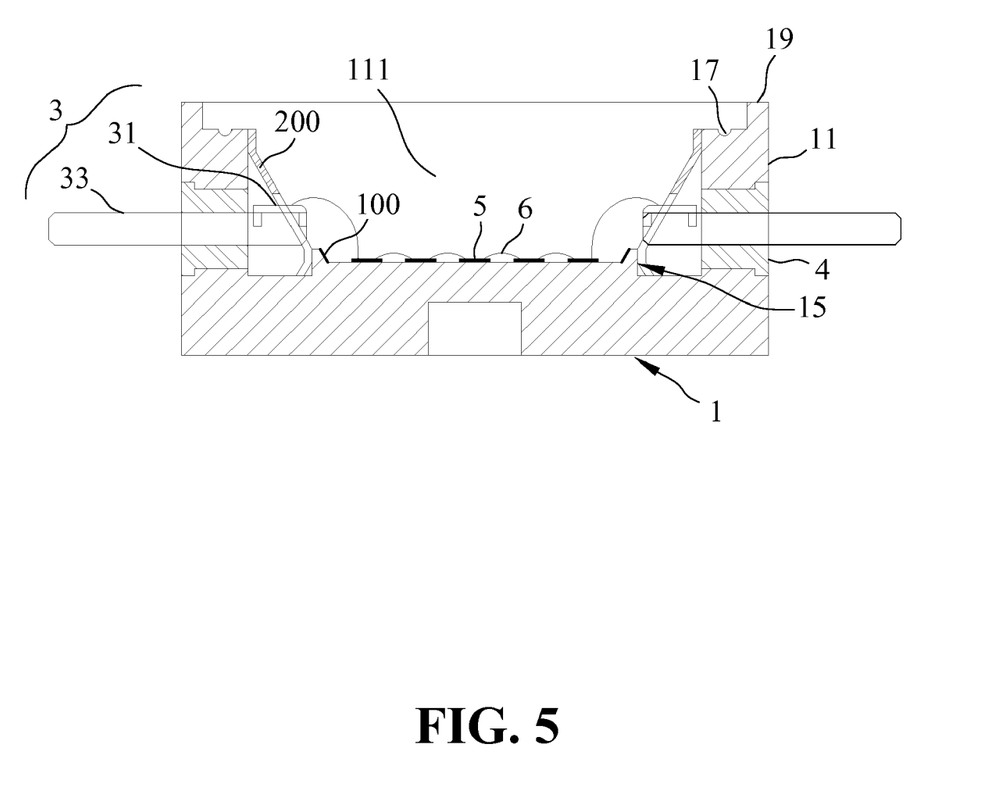

As shown in FIG. 5, a plurality of LED dices 5 are installed on the bottom of the accommodating space 111. Each of the LED dice 5 is electrically connected to each other by wire bonding, and the LED dices 5 are electrically connected to the lead frame 3 through a plurality of wires 6 so as to form an electric circuit. In one embodiment, the plurality of LED dices 5 are installed at the bottom of the light outlet opening 151. When the light is emitted by the LED dices 5, a portion of light which is directed back into the light outlet opening 151 can be reflected outward by the first and the second light reflectors 100, 200, and thereby the light emitting efficiency of the LEDs is increased. The LED dices 5 are preferably arranged in an array.

Figure 6:
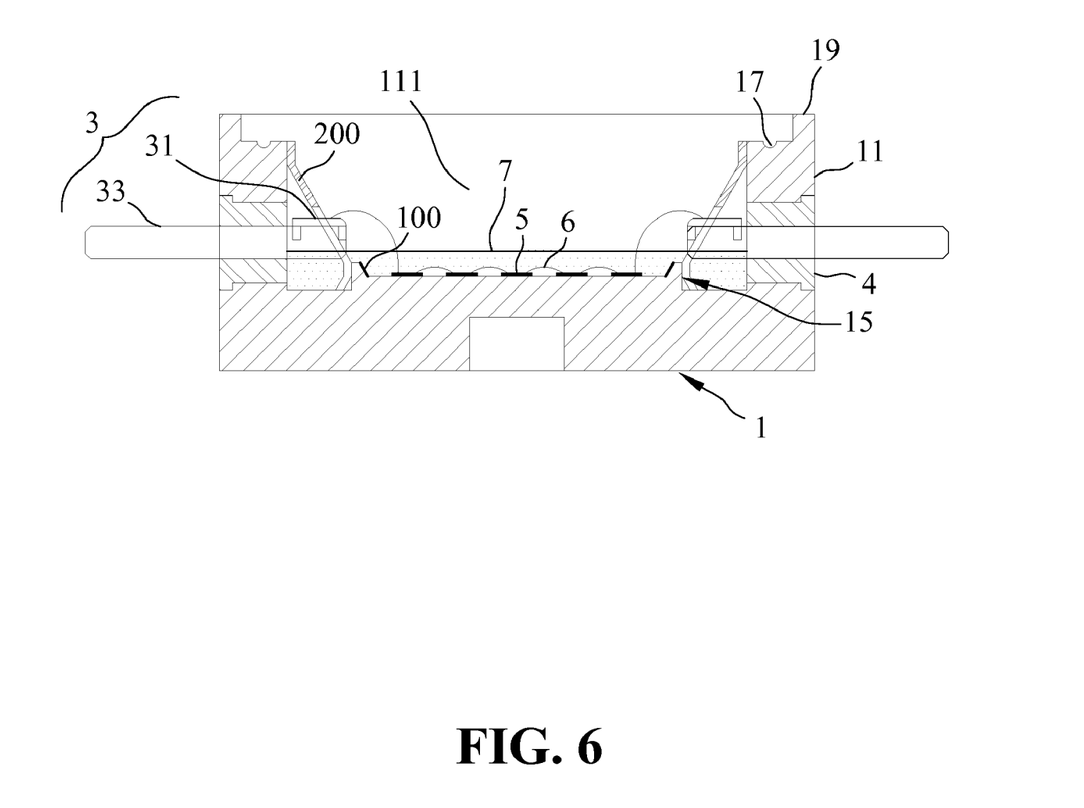
Figure 7:
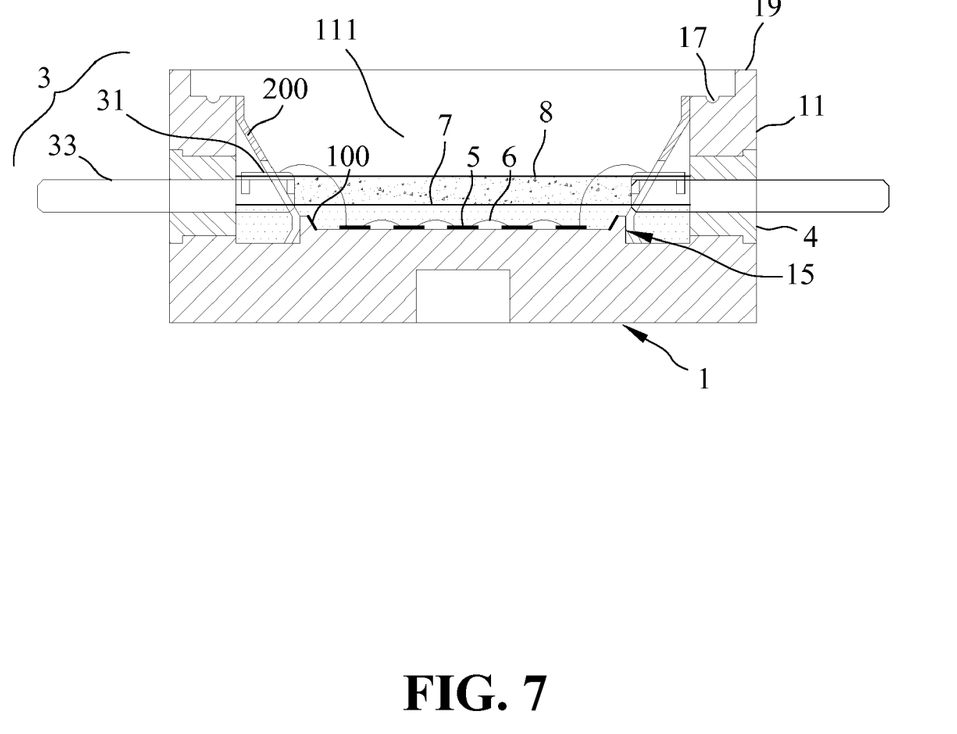
Figure 8:
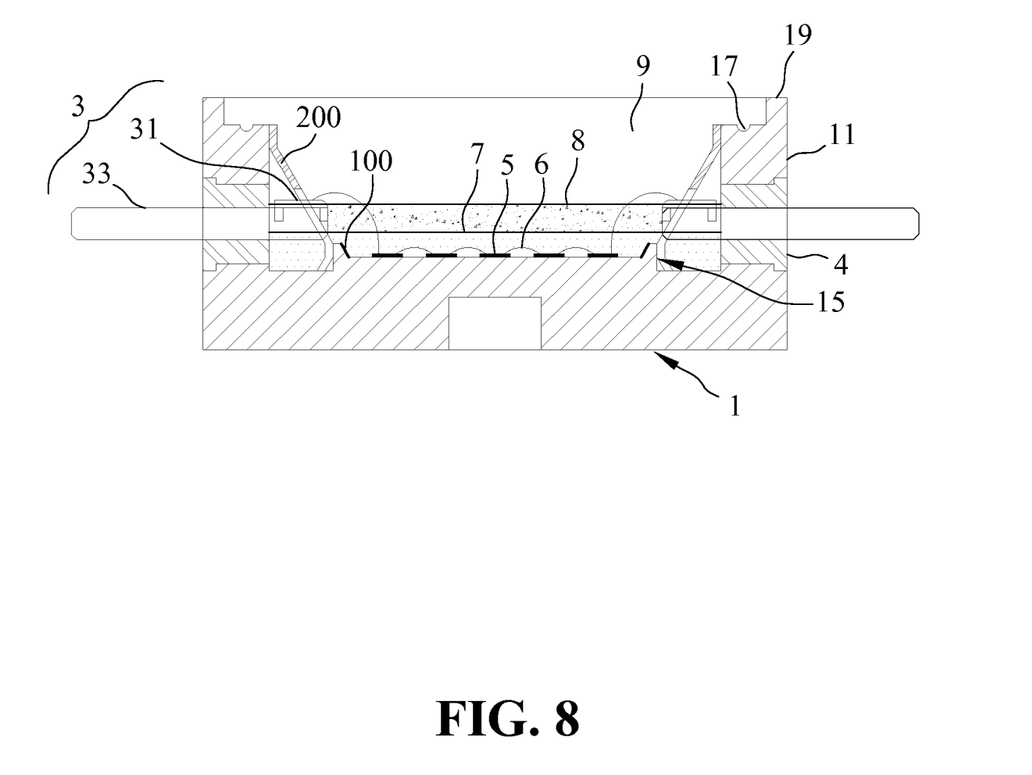

As shown in FIG. 6, a dice protection layer 7 is formed on the LED dices 5 for covering and protecting the LED dices 5 and the wires 6. The material of the dice protection layer 7, for example, can be silicone. As shown in FIG. 7, a fluorescent layer 8 is further formed on the dice protection layer 7. As shown in FIG. 8, a silicone layer 9 is further formed on the fluorescent layer 8 for protecting the fluorescent layer 8.

Figure 9:
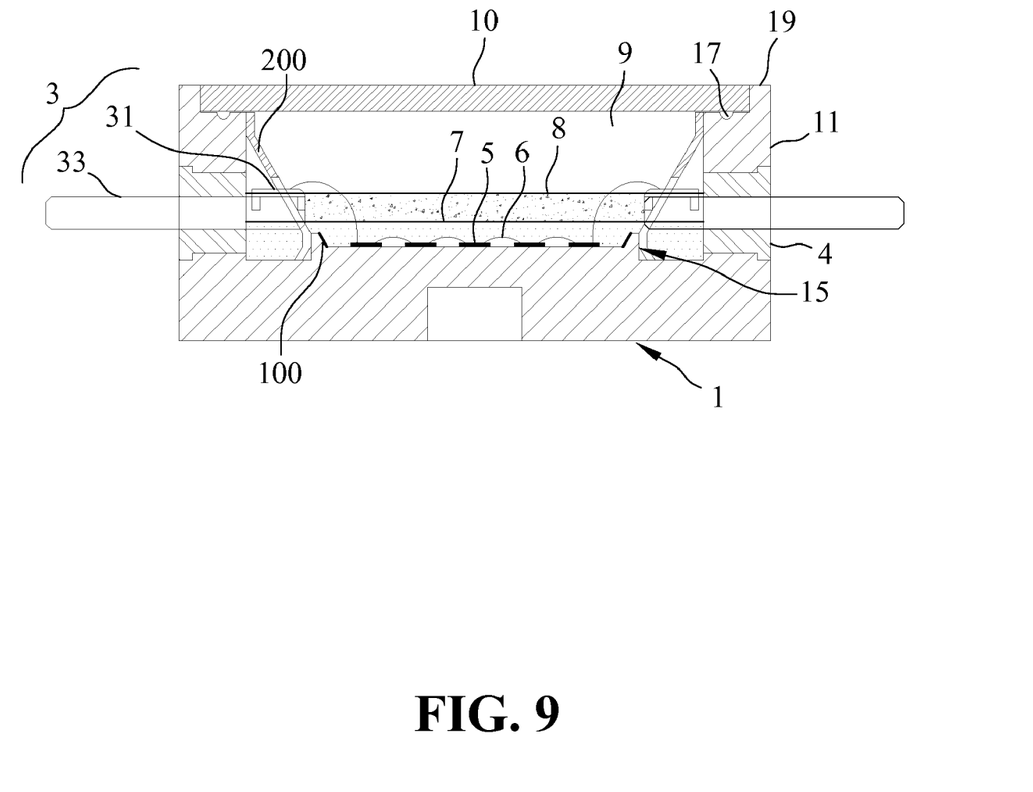
Figure 12:
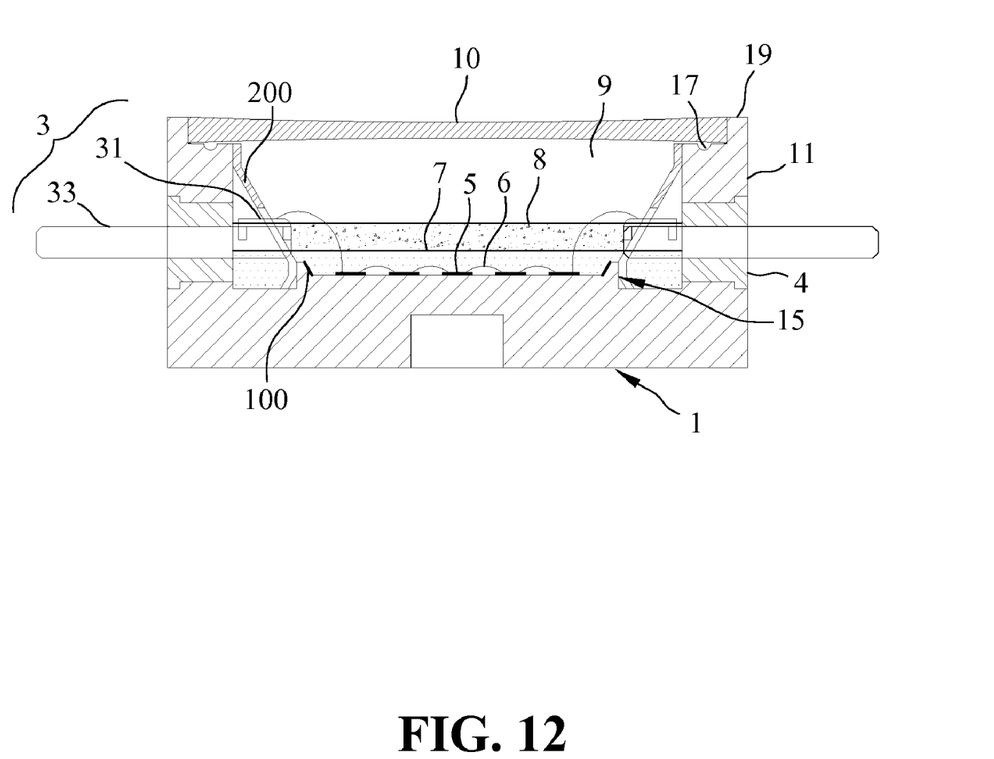
FIG. 12 is a schematic cross sectional view of an airtight multi-layer array type LED package obtained in accordance with the first embodiment of the present invention, except that it uses a concave lens instead of a plane lens.
Figure 13:
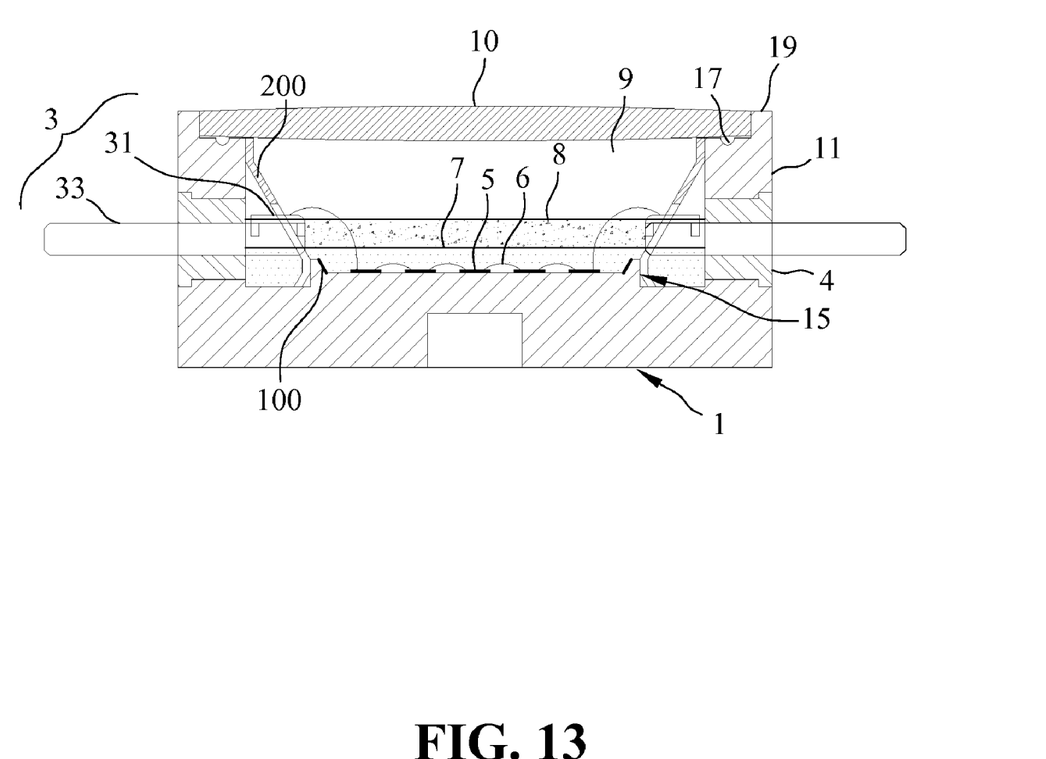
FIG. 13 is a schematic cross sectional view of an airtight multi-layer array type LED package obtained in accordance with the first embodiment of the present invention, except that it uses a convex lens instead of a plane lens.

As shown in FIG. 9, an optical glass cover 10 is installed on the top of the surface of the airtight metal frame 11, and the optical glass cover 10 is tightly jointed with the top surface of the airtight metal frame 11 and the inner portion of the sealing frame wall 19 by, for example, laser bonding, thermal bonding, solder bonding, and melting bonding methods, or other suitable methods. The optical glass cover 10 can be a plane lens, a concave lens, or a convex lens, as shown in FIGS. 12 and 13, depending on the needs of the application.

Figure 10:
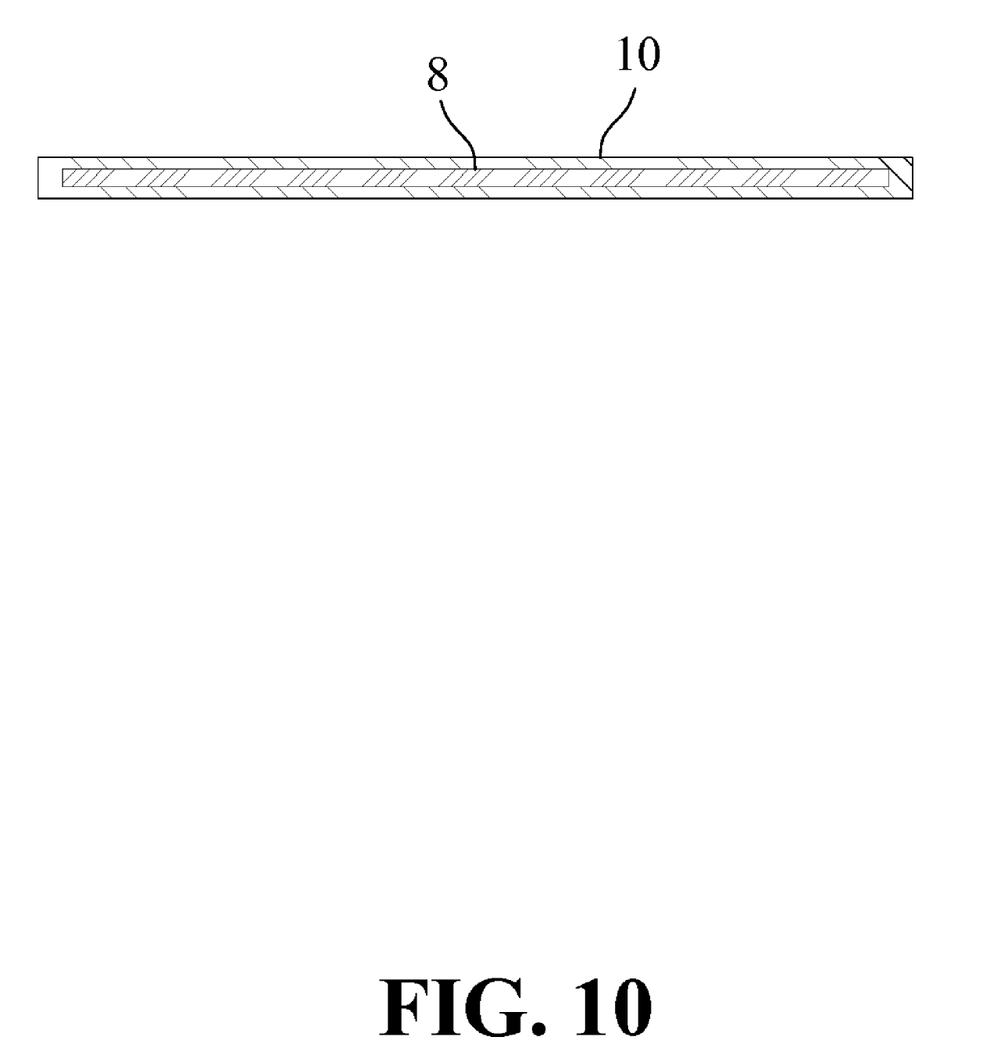
FIG. 10 is a schematic cross sectional view of an optical glass cover with a fluorescent layer formed therein in accordance with the second embodiment of the present invention.
Figure 11:
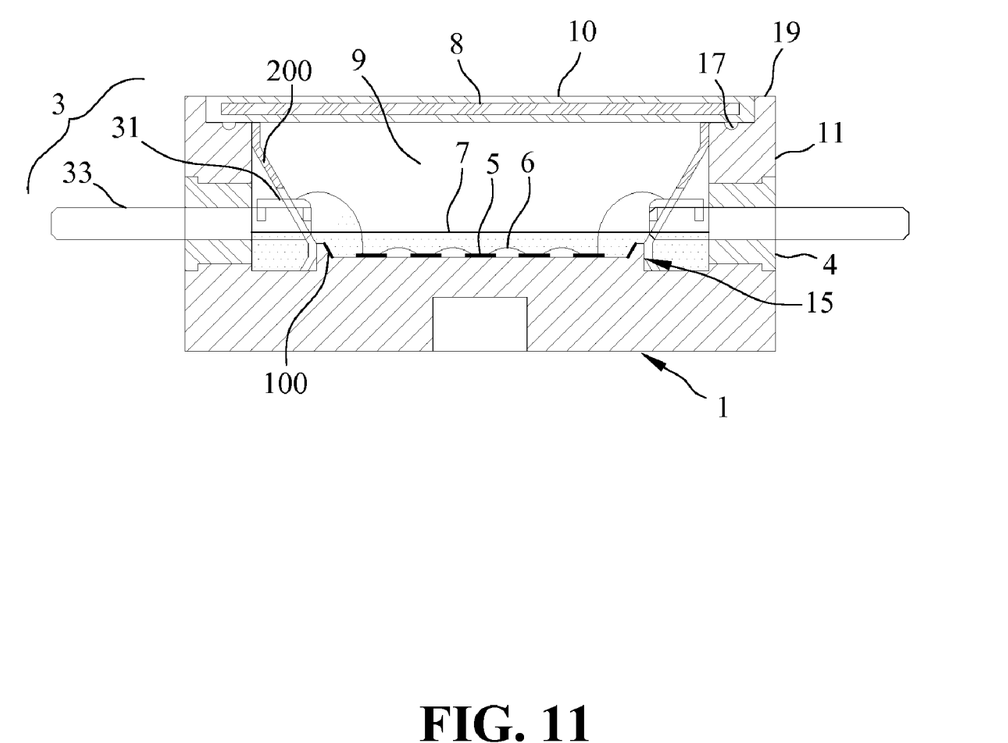
FIG. 11 is a schematic cross sectional view of an airtight multi-layer array type LED package obtained in accordance with the second embodiment of the present invention.

In a second embodiment of the present invention, as shown in FIG. 10, the fluorescent layer 8 can be preset inside the optical glass cover 10. As shown in FIG. 11, the silicone layer 9 is directly formed on the dice protection layer 7, and the optical glass cover 10 with the fluorescent layer 8 preset therein is then installed on the top of the airtight metal frame 11 in the same manner as the previous embodiment. Thus, the packaging process of the present invention is completed. It is noted that the fluorescent layer 8 can be prevented from deteriorating caused by the moisture when the fluorescent layer 8 is preset inside the optical glass cover 10.

Because the packaging structure of the airtight multi-layer array type LED of the present invention is completely sealed, the external moisture cannot enter it. Furthermore, the silicone layer 9 is used for preventing the fluorescent layer 8, the dice protection layer 7 and the LED dices 5 from deteriorating caused by the moisture. Therefore, the airtight multi-layer array type LED of the present invention is suitable to be used in deep sea or an industrial environment with high humidity. Moreover, the airtight metal frame 11 is integrally formed with the metal substrate 1 so that the structural strength of the airtight multi-layer array type LED of the present invention is further reinforced, and thereby the airtight multi-layer array type LED of the present invention can be used in the air space or military environments where huge-impact forces and extreme-pressure may occur.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A method for packaging an airtight multi-layer array type LED, comprising:

integrally forming a metal substrate with an airtight metal frame, the airtight metal frame forming a metal sidewall surrounding an accommodating space;

forming a light outlet platform on a bottom of the accommodating space, the light outlet platform surrounding a light outlet opening;

forming an airtight sealing groove around an upper surface of the airtight metal frame, a sealing frame wall being upwardly and vertically extended from an outer edge of a top surface of the airtight metal frame;

forming two horizontal sealing through holes through the metal sidewall of the airtight metal frame, a lead frame being inserted through each of the horizontal sealing through holes, all interstitial space in the two horizontal sealing through holes being completely sealed with a sealing material;

disposing a first light reflector to a sidewall of the light outlet platform, and disposing a second light reflector on an interior of the airtight metal frame, a lower portion of one side of the second light reflector being placed against an outside of the light outlet platform, an upper portion of the other side of the second light reflector being placed against an inner wall of the airtight metal frame, wherein the first and the second light reflectors receive light, and then reflect the received light outward;

installing a plurality of LED dices on the bottom of the accommodating space, each of the LED dice being electrically connected to each other by wire bonding, the LED dices being electrically connected to the lead frame through a plurality of wires so as to form an electric circuit;

forming a dice protection layer on the LED dices for covering and protecting the LED dices;

forming a silicone layer on the dice protection layer;

presetting a fluorescent layer inside an optical glass cover; and installing the optical glass cover with the fluorescent layer preset therein on a top surface of the airtight metal frame, wherein the optical glass cover is tightly jointed with the top surface of the airtight metal frame and an inner portion of the sealing frame wall.

2. The method according to claim 1, wherein the airtight metal frame is integrally formed with the metal substrate by casting or tooling.

3. The method according to claim 1, wherein the sidewall of the light outlet opening is inclined at an angle of not more than 90 degrees with respect to a bottom of the light outlet opening, and the sidewall is served as a light reflecting plane.

4. The method according to claim 1, wherein the material of the metal substrate is at least one of aluminum, copper, and copper alloy.

5. The method according to claim 1, wherein a protective reflection layer is coated on the inner wall of the airtight metal frame, and the material of the protective reflection layer is at least one of silver and nickel.

6. The method according to claim 1, wherein the sidewall of the light outlet opening is inclined with respect to a bottom of the light outlet opening.

7. The method according to claim 1, wherein the sealing material is at least one of glass, ceramic, and glass ceramic.

8. The method according to claim 1, wherein the second light reflector is wide at the top and narrow at the bottom.

9. The method according to claim 1, wherein the lead frame includes a connection plate and a guide rod, and the guide rod is inserted through the horizontal sealing through hole, and the guide rod has an inner end and an outer end, and the inner end of the guide rod is connected with a connection plate, and the outer end of the guide rod is connected to a power source.

10. The method according to claim 1, wherein the optical glass cover is tightly jointed with the top surface of the airtight metal frame and the inner portion of the sealing frame wall by laser bonding, thermal bonding, solder bonding, and melting bonding methods.

11. The method according to claim 1, wherein the optical glass cover is one of a plane lens, a concave lens, and a convex lens.

12. A method for packaging an airtight multi-layer array type LED, comprising:

integrally forming a metal substrate with an airtight metal frame, the airtight metal frame forming a metal sidewall surrounding an accommodating space;

forming a light outlet platform on a bottom of the accommodating space, the light outlet platform surrounding a light outlet opening;

forming an airtight sealing groove around an upper surface of the airtight metal frame, a sealing frame wall being upwardly and vertically extended from an outer edge of a top surface of the airtight metal frame;

forming two horizontal sealing through holes through the metal sidewall of the airtight metal frame, a lead frame being inserted through each of the horizontal sealing through holes, all interstitial space in the two horizontal sealing through holes being completely sealed with a sealing material;

disposing a first light reflector to a sidewall of the light outlet platform, and disposing a second light reflector on an interior of the airtight metal frame, a lower portion of one side of the second light reflector being placed against an outside of the light outlet platform, an upper portion of the other side of the second light reflector being placed against an inner wall of the airtight metal frame, wherein the first and the second light reflectors receive light, and then reflect the received light outward;

installing a plurality of LED dices on the bottom of the accommodating space, each of the LED dice being electrically connected to each other by wire bonding, the LED dices being electrically connected to the lead frame through a plurality of wires so as to form an electric circuit;

forming a dice protection layer on the LED dices for covering and protecting the LED dices;

forming a fluorescent layer on the dice protection layer;

forming a silicone layer on the fluorescent layer; and installing an optical glass cover on a top surface of the airtight metal frame, wherein the optical glass cover is tightly jointed with the top surface of the airtight metal frame and an inner portion of the sealing frame wall.

13. The method according to claim 12, wherein the airtight metal frame is integrally formed with the metal substrate by casting or tooling.

14. The method according to claim 12, wherein the sidewall of the light outlet opening is inclined at an angle of not more than 90 degrees with respect to a bottom of the light outlet opening, and the sidewall is served as a light reflecting plane.

15. The method according to claim 12, wherein the material of the metal substrate is at least one of aluminum, copper, and copper alloy.

16. The method according to claim 12, wherein a protective reflection layer is coated on the inner wall of the airtight metal frame, and the material of the protective reflection layer is at least one of silver and nickel.

17. The method according to claim 12, wherein the sidewall of the light outlet opening is inclined with respect to a bottom of the light outlet opening.

18. The method according to claim 12, wherein the sealing material is at least one of glass, ceramic, and glass ceramic.

19. The method according to claim 12, wherein the second light reflector is wide at the top and narrow at the bottom.

20. The method according to claim 12, wherein the lead frame includes a connection plate and a guide rod, and the guide rod is inserted through the horizontal sealing through hole, and the guide rod has an inner end and an outer end, and the inner end of the guide rod is connected with a connection plate, and the outer end of the guide rod is connected to a power source.

21. The method according to claim 12, wherein the optical glass cover is tightly jointed with the top surface of the airtight metal frame and the inner portion of the sealing frame wall by laser bonding, thermal bonding, solder bonding, and melting bonding methods.

22. The method according to claim 12, wherein the optical glass cover is one of a plane lens, a concave lens, and a convex lens.

* * * * *